United States Patent [19]

Tupuri et al.

[11] Patent Number: 5,617,431
[45] Date of Patent: Apr. 1, 1997

[54] METHOD AND APPARATUS TO REUSE EXISTING TEST PATTERNS TO TEST A SINGLE INTEGRATED CIRCUIT CONTAINING PREVIOUSLY EXISTING CORES

[75] Inventors: Raghuram S. Tupuri; Harikumar B. Nair, both of Austin, Tex.

[73] Assignee: Advanced Micro Devices, Inc., Sunnyvale, Calif.

[21] Appl. No.: 284,163

[22] Filed: Aug. 2, 1994

[51] Int. Cl.⁶ .................................................. G06F 11/00
[52] U.S. Cl. ...................................................... 371/27
[58] Field of Search .............................. 371/27, 24, 25.1; 364/488, 489, 481, 490, 550, 579, 580, 264.5, 264.1; 324/73.1, 158 R

[56] References Cited

U.S. PATENT DOCUMENTS

| | | | |
|---|---|---|---|
| 4,493,045 | 1/1985 | Hughes, Jr. | 364/580 |
| 4,710,931 | 12/1987 | Bellay et al. | 371/25 |
| 4,728,883 | 3/1988 | Green | 324/73 R |
| 4,855,670 | 8/1989 | Green | 324/73 R |
| 5,115,435 | 5/1992 | Langford II et al. | 371/22.3 |
| 5,329,471 | 7/1994 | Swoboda et al. | 364/578 |
| 5,477,545 | 12/1995 | Huang | 371/22.3 |

Primary Examiner—Robert W. Beausoliel, Jr.
Assistant Examiner—Stephen C. Elmore
Attorney, Agent, or Firm—Foley & Lardner

[57] ABSTRACT

Test vectors are applied to a single integrated circuit containing at least one logic core for which a preexisting test vector set exists. Each test vector ordinarily applied in one cycle to test a core by itself, is converted into a first and second test vector. The first test vector is applied to input pins of the single integrated circuit during a first time period. Test registers connected to the input pins of the integrated circuit are loaded with signal values from the first test vector. The test registers are loaded according to a load signal. The test registers are connected between the input pins and a first set of drivers, the drivers being connected to the logic core under test. The second test vector is applied through the input pins to a second set of drivers during a second time period. A test mode signal is provided from a test interface to control the drivers. The signals stored in the test registers are provided concurrently with the signals applied to the input pins of the integrated circuit during the second time period to the logic core under test through the first and second drivers respectively.

19 Claims, 7 Drawing Sheets

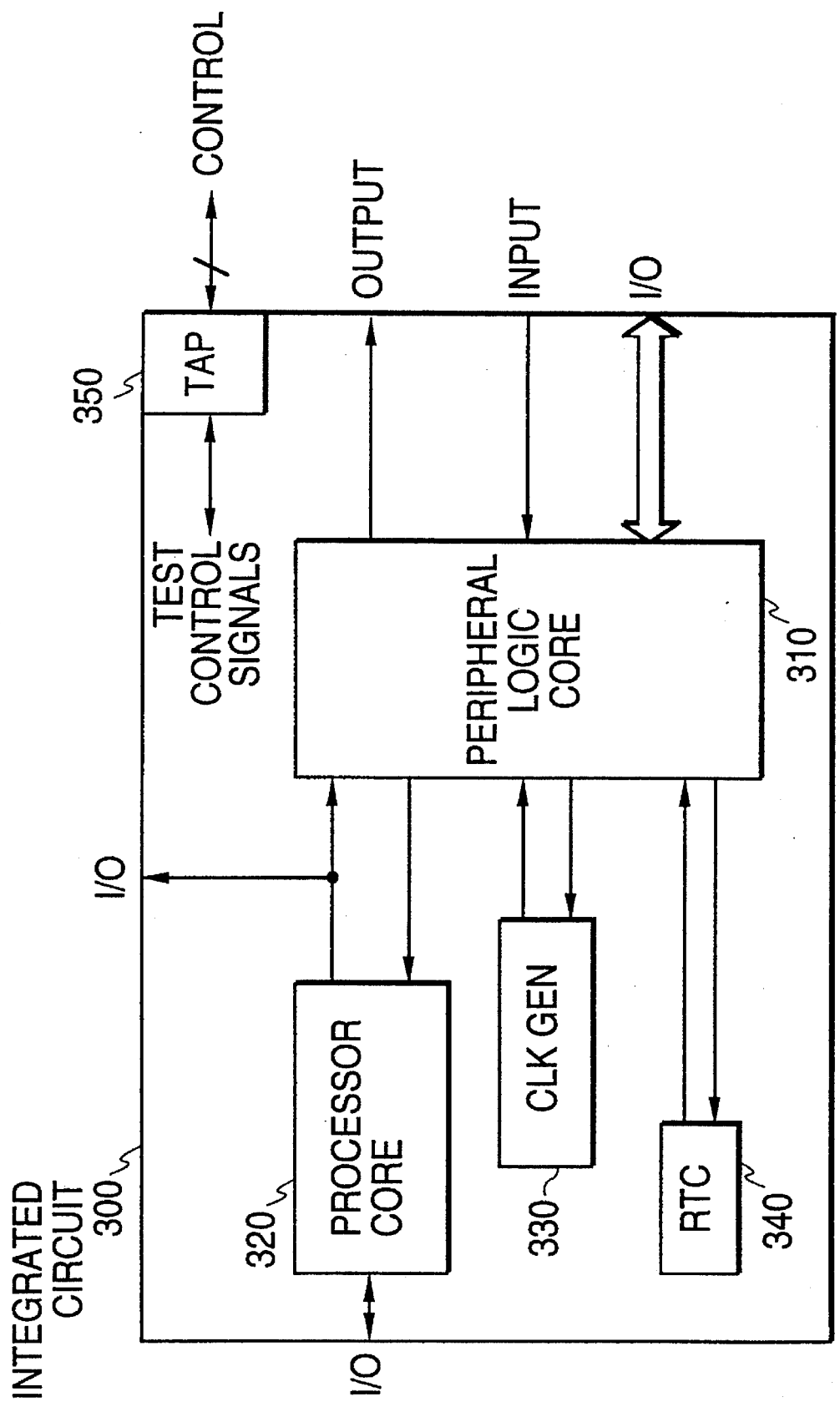

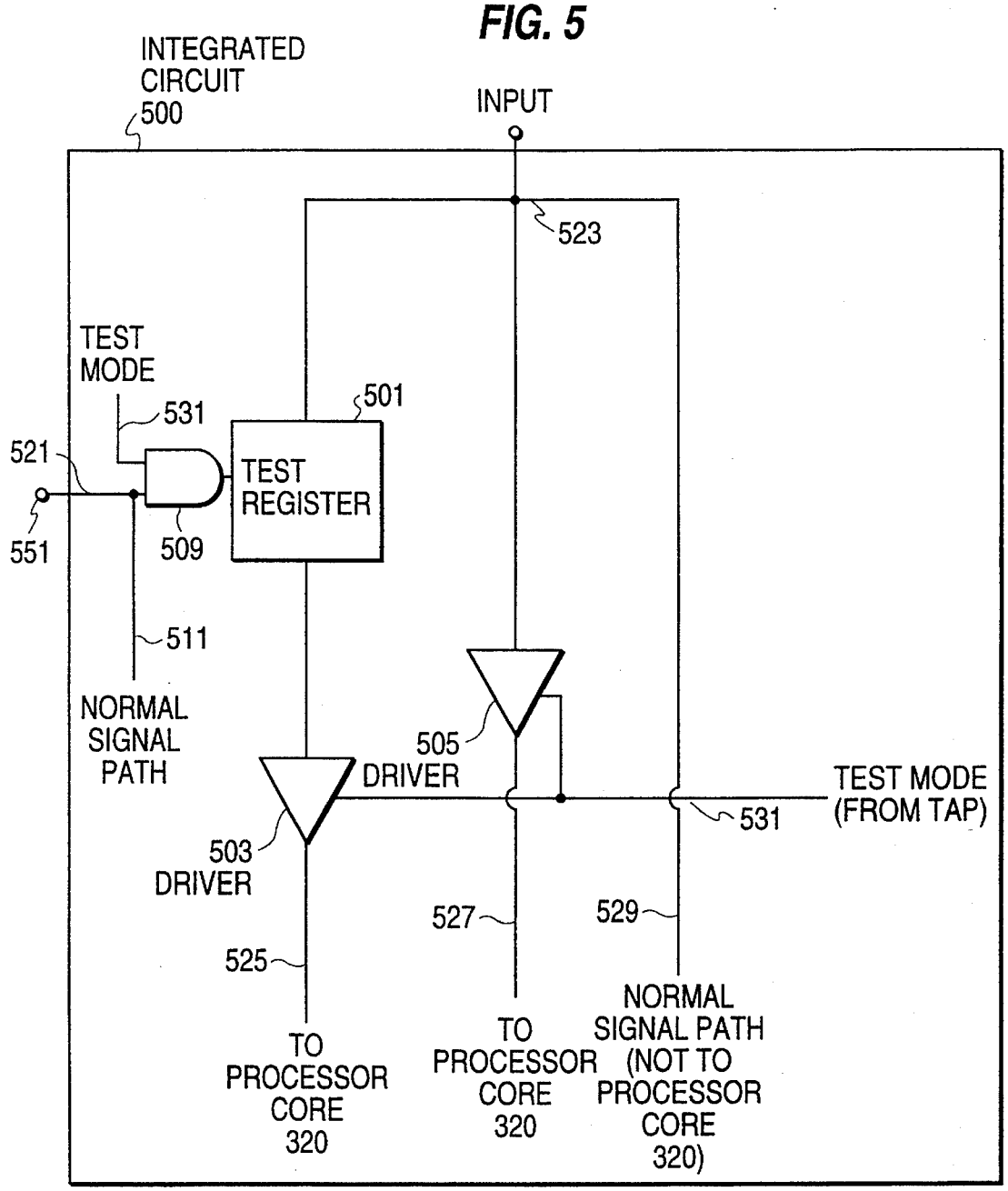

BOUNDARY-SCAN ARCHITECTURE

METHOD AND APPARATUS TO REUSE EXISTING TEST PATTERNS TO TEST A SINGLE INTEGRATED CIRCUIT CONTAINING PREVIOUSLY EXISTING CORES

BACKGROUND OF THE INVENTION

1. Field of Invention

This invention relates to a method and apparatus for testing semiconductor devices, and more specifically, to a method and apparatus for applying pre-existing test patterns to a single integrated circuit incorporating two or more pre-existing logic blocks (cores) for which the test patterns already exist.

2. Description of the Related Art

Testing integrated circuits is a key component of the manufacturing process. In many designs, existing module cores, i.e., blocks of logic that have been previously designed, are reused in different applications. For instance, a processor (e.g. a '386) may exist as a core block of logic which can be integrated into any of a number of different applications on different integrated circuits. Integrating two or more pre-existing cores into an integrated circuit for a new application can lead to unique testing problems.

The time to market requirements for such a product make it extremely difficult to develop a complete set of test vectors from scratch in a timely manner. Additionally, many of the existing logic cores were not designed originally with an emphasis on design for testability techniques. Thus, it is difficult to apply standard design for test (DFT) techniques without significantly modifying the core design to achieve the desired fault coverage for such chips. Such standard design for test techniques include level sensitive scan design (LSSD) and other scan approaches which allow access to internal registers, both to apply test patterns and to observe test results. Additionally, fault simulation on extremely large designs imposes severe time penalties, making it difficult to assure a high fault coverage for the integrated design. The costs are prohibitive in terms of time and manpower, to develop a completely new set of test vectors for logic cores which are being integrated and which do not have standard DFT techniques implemented.

For newly designed integrated circuits utilizing more than one existing core, there may be fewer input/output (I/O) pins available on the new integrated circuit than the combined I/O requirements of the existing cores. This makes the access to the cores to apply the previously developed test vectors difficult.

One potential solution to this problem is to incorporate scan registers to provide inputs for each I/O pin for the core which is not accessible from the pins of the new integrated circuit. These scan registers function as the source of the test pattern signal for inaccessible core I/O pins. Scan registers could also be used to store test results. The scan registers must be loaded for each vector applied and unloaded to get the test results. Such scan solutions are time consuming in conducting the testing and may require significant additional chip area to accommodate the scan registers.

FIG. 1a shows a typical core 10 for which test patterns are developed. FIG. 1b shows the test patterns 140 as a set of 1 to m test vectors 150 having a vector length of n for each vector. The core 10 has input pins shown generally as 120 and 121, output pins generally shown as 122 and bidirectional input/output (I/O) pins 123. In order to test the core 10, each of the test vectors from test set 150 are applied to the input pins and bidirectional pins during a particular clock cycle.

The application of each particular test vector pattern will result in the core under test 10 outputting results from the output pins (and certain of the bidirectional pins) according to the input pattern applied. These results are then compared to expected results in order to determine whether the core under test performed satisfactorily. This sequence of applying the test vector and comparing the test vector to expected results is continued until the entire set of m test vectors has been applied.

Where design for test techniques have not been incorporated into the cores, the test patterns typically are functional patterns developed to test the core. More advanced design for test techniques provide observation points for an applied test pattern internal to the integrated circuit under test, such that the results from the applied test pattern can be monitored at multiple internal input nodes and can be compared to expected results. However, scan architectures typically used in such advanced techniques cause the testing to be time consuming. The input/output lines, including the bidirectional lines, indicated in FIG. 1a include signal I/O, i.e., data and control lines. In addition to the signal I/O, the core under test will have the required power and ground lines.

When two or more existing cores such as core 10 are integrated into a device, it is time consuming to develop a whole new set of test vectors to test the new device.

If test vectors, which were created to test cores in previous designs, can be used for a new design incorporating those cores, the test generation time for the new cores could be reduced, the need for extensive fault simulation for the new design would be eliminated and high quality tests could be maintained. Development of a full set of test vectors in a short period of time while integrating two or more cores into a single integrated circuit is desirable.

SUMMARY OF THE INVENTION

It is therefore an object of this invention to provide a method to reuse existing test patterns for existing cores. It is a further object of the invention to reduce test generation time for an integrated circuit incorporating more than one existing core and to avoid developing a completely new set of test vectors.

It also an object of this invention to eliminate the need for extensive fault simulation on new integrated circuits incorporating more than one existing core.

It is a further object of the invention to ensure that existing test vectors can be utilized in newly designed integrated circuits including more than one existing core, even though the I/O requirements of each of the cores by themselves or combined, are greater than the I/O capability of the integrated circuit on which the cores now reside.

These and other objects of the invention are achieved by testing each core separately using the existing test patterns, by defining test modes to ensure that the cores can be tested separately. Input/output pins of the integrated circuit chip are redefined as input/output pins of the core being tested. Additionally, specific I/O pins are redefined to provide control signals for applying the test vectors to the core under test. A serial test interface, such as the interface defined by the Joint Test Action Group (JTAG) test access port (TAP), is utilized to provide control signals required in the test approach.

In cases where there is an insufficient number of input pins, the application of the test vector is divided into two cycles, a load cycle and an apply cycle. In this way, each input pin can provide multiple inputs such that all the input pins of the module under test have the original test vector applied during a particular cycle.

In order to accomplish this result, according to the invention, each test vector in the test vector set is divided into a first test vector and a second test vector. The first test vector is mapped to particular input pins and applied during a first clock cycle and loaded into test registers. During a second clock cycle, the signal values in the test registers are applied through drivers to the input pins of the core under test. Simultaneously, the input pins of the integrated circuit, including those previously used to load the test registers, are driven with a signal from the second test vector and are applied concurrently with the signals from the test registers to the core module input pins.

According to the invention, a method is provided for applying test vectors to a single integrated circuit containing at least one logic core for which a preexisting test vector set exists, the set including a plurality of test vectors which are normally applied in one cycle. The method includes the steps of converting each test vector previously applied in one cycle into a first and second test vector. The first test vector is applied during a first cycle and the second test vector is applied during a second cycle, so that each test vector of the test vector set previously applied in one cycle to a logic core is applied in two cycles.

In performing the testing according to the invention, the first test vector is applied to input pins of the single integrated circuit during the first time period. Test registers, connected to the input pins of the integrated circuit, are loaded with signals from the first test vector. Each test register is connected between one of the input pins and one of a set of first drivers, the first drivers being connected to the logic core under test. Each test register is loaded according to a load signal. The second test vector is applied to the input pins during a second time period. A test mode enable signal is provided from the test interface and is connected to the first drivers and second drivers.

The signals stored in the test registers are provided concurrently with the signals applied to the input pins of the integrated circuit during the second time period to the logic core under test through the first and second drivers, respectively.

The test results are observed through the I/O pins of the integrated circuit. These steps are repeated until the logic core is tested with all the prexisting test vectors.

These and other objects and advantages of the invention will become more apparent from the following description and accompanying drawings.

BRIEF DESCRIPTION OF THE DRAWINGS

FIG. 2a shows two embedded preexisting cores where the inputs and outputs of both cores are available at the I/O pins of the semiconductor of the integrated circuit;

FIG. 2b shows preexisting test vectors A and preexisting test vectors B associated with the cores shown in FIG. 2a;

FIG. 3 shows an example of multiple cores being integrated into a single integrated circuit;

FIG. 5 shows a detail where a test register is used to provide sufficient inputs to the device under test.

DETAILED DESCRIPTION OF THE PREFERRED EMBODIMENTS

Figure 1A:
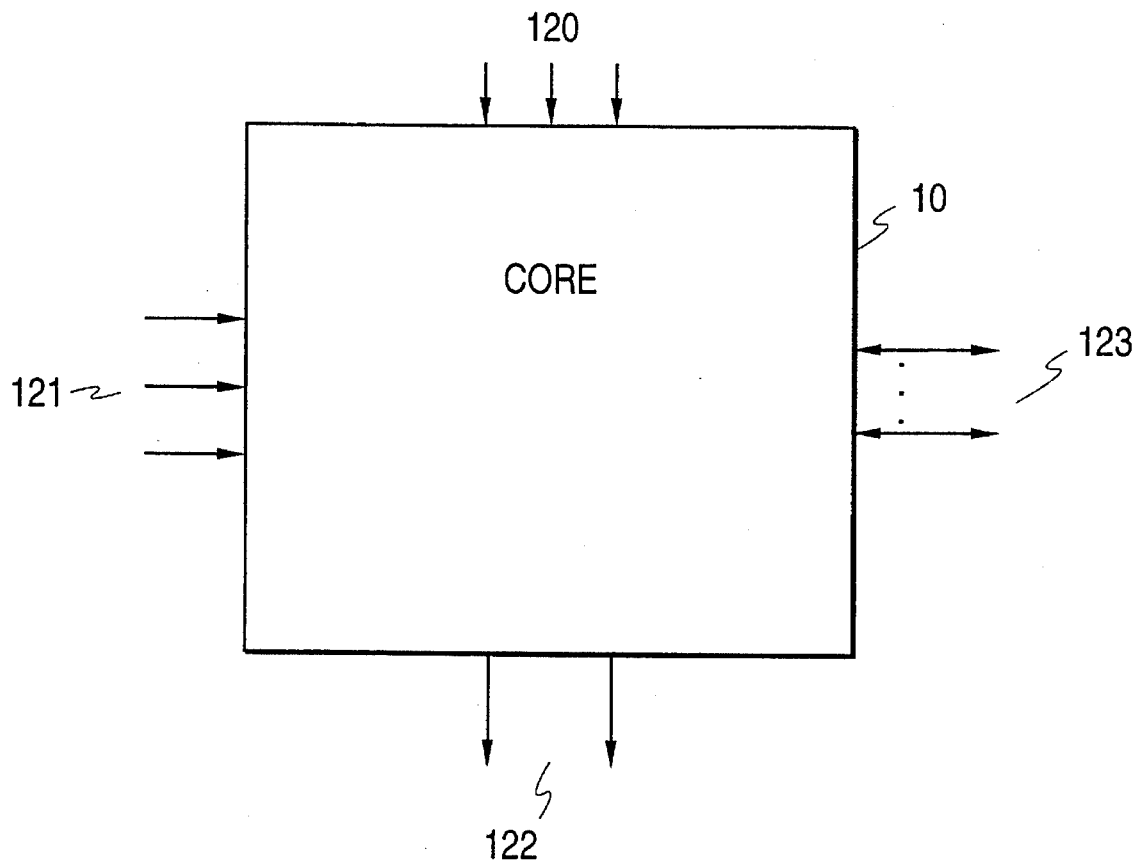
FIG. 1a shows a typical preexisting core.
Figure 1B:
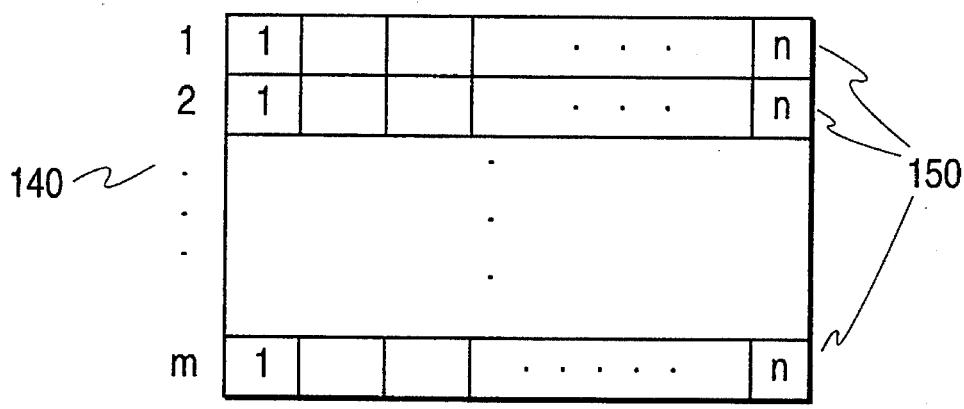
FIG. 1b shows a set of preexisting test vectors.
Figures 2A, 2B:
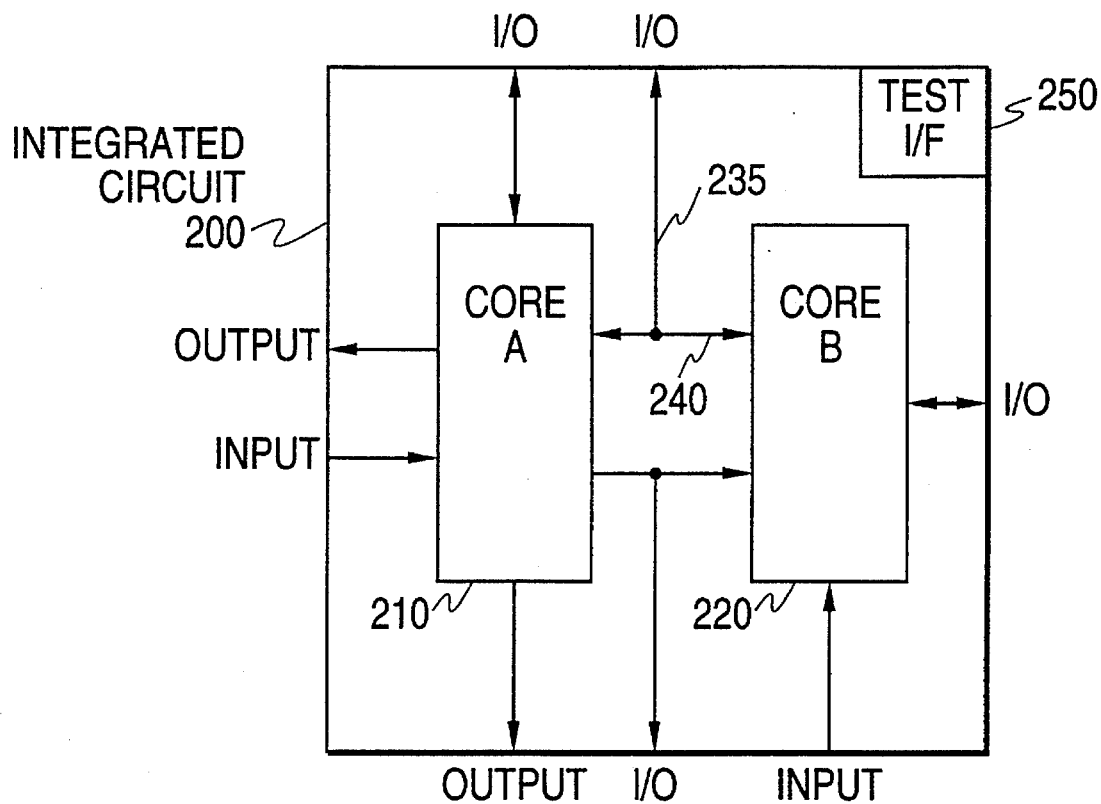

FIG. 2a shows a simple integration of two preexisting cores 210 and 220 into integrated circuit 200. In this instance, all of the input and output for cores 210 and 220 are available at the input and outputs of integrated circuit 200. The application of the test vectors of the preexisting test vectors sets shown in FIG. 2b are straightforward. For the particular instance shown, little additional logic is needed in integrated circuit 200 and no modification is required to test vectors A and B in order to apply the test vectors. Additional logic is required in integrated circuit 200 to ensure that the test vectors can be applied to core A independently of the test vectors applied to core B.

Specifically, when test vectors are applied to core 210, the drivers at pins 240 of core 220 must be disabled to ensure that core A can receive test inputs and output test results. Such a result can be readily achieved by disabling the appropriate drivers in the appropriate core as test patterns are applied to the other core. Such test control signals can either be provided via pins if available on the integrated circuit 200 or may be provided through a serial test interface shown in FIG. 2a as test interface 250.

Figure 6:
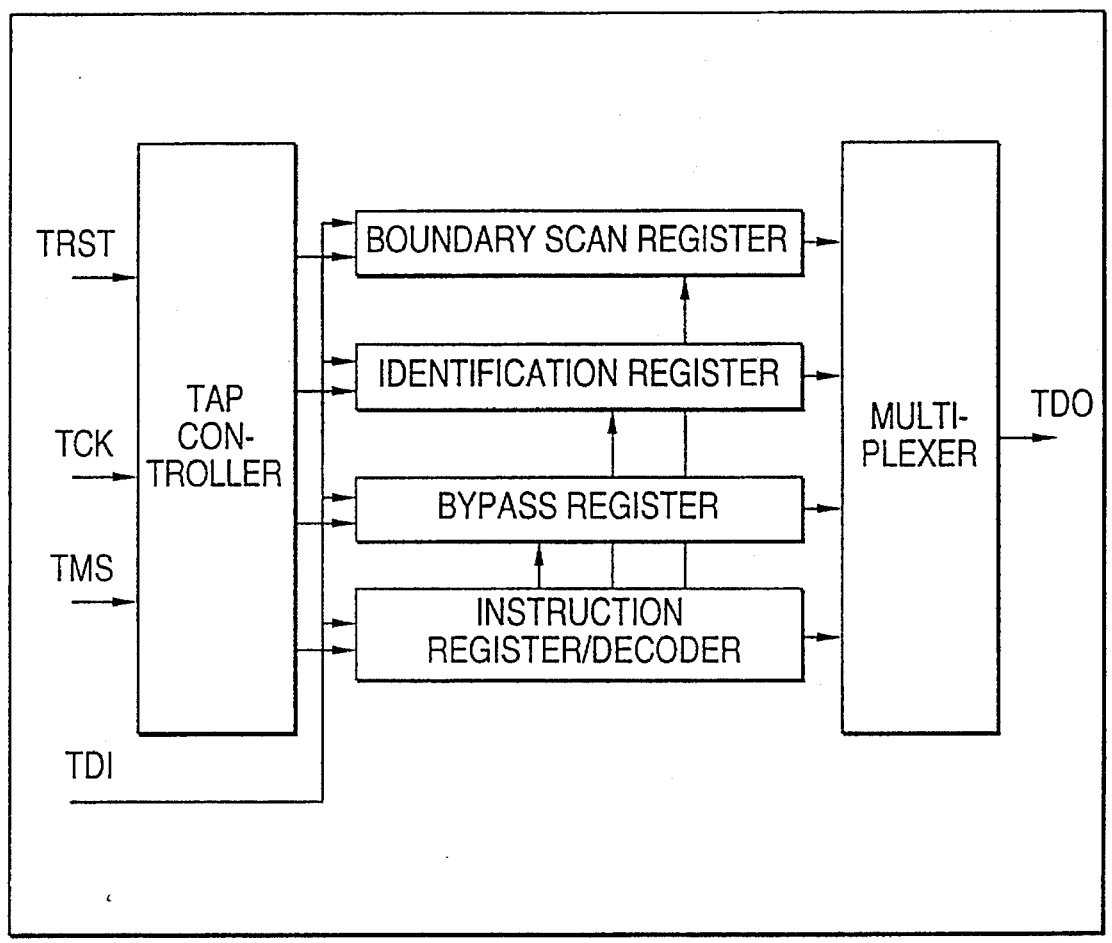
FIG. 6 is a high level block diagram of a test access port.

In preferred embodiments of the invention, the serial test interface utilized is the JTAG test access port (TAP) which is described in IEEE standard 1149.1 (1990) and is incorporated herein by reference. The architecture of the JTAG test port is shown in FIG. 6.

FIG. 3 shows a more complex and more typical testing problem associated with embedding preexisting cores in integrated circuits. FIG. 3 shows four embedded cores, 310, 320, 330 and 340 integrated into integrated circuit 300. Specifically, core 310 is a peripheral logic core, core 320 is a preexisting processor core, core 330 is a preexisting clock generating core and 340 is a real time clock (RTC).

For the embodiment shown in FIG. 3, there are insufficient I/O pins available on integrated circuit 300 to provide access to all of the I/O pins on all of the cores. In order to include sufficient input signals to test the existing cores using the existing test patterns, additional logic must be incorporated into integrated circuit 300.

Figure 4A:
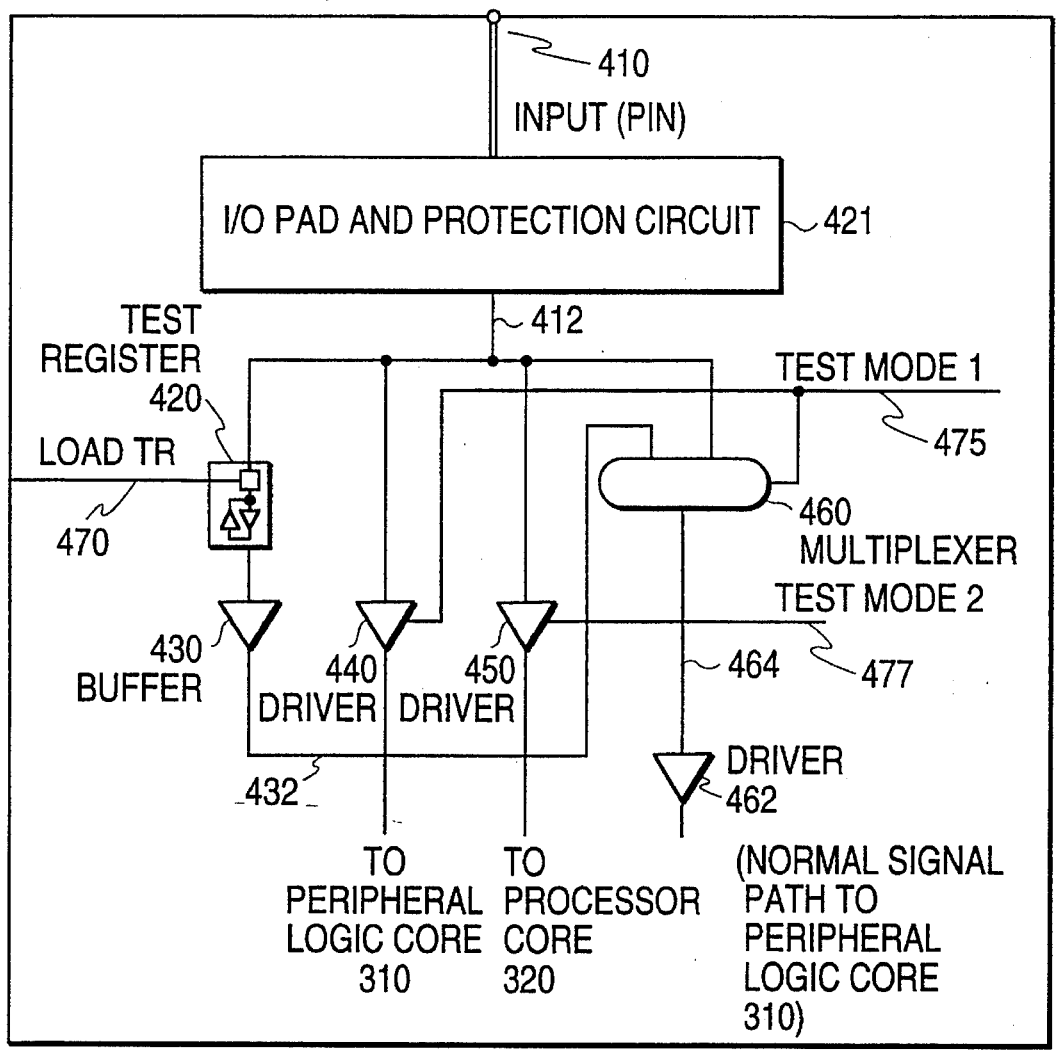
FIG. 4a shows an embodiment according to the invention where at least two preexisting cores have been integrated onto a single integrated circuit and test registers are incorporated to provide additional inputs to the core under test.

One embodiment according to the invention incorporating the required additional logic is shown in FIG. 4a where I/O pin 410, which is an I/O pin of integrated circuit 300, is connected to test register 420 through I/O pad and protection circuit 421. A load test register signal 470 (LOAD TR) is provided to test register 420 to control loading of the test register 420. The load test register signal 470 may originate from a pin of the integrated circuit 300 or could be supplied from test access port (TAP) 350.

Input 410 is additionally connected to driver 440, driver 450 and multiplexer 460. Test mode 1 signal 475 originates either from a test input pin or more typically from a test access port, such as a JTAG port. The test register 420 is connected to multiplexer 460 through buffer 430. Test mode 1 signal 475 also functions as a selector for multiplexer 460 to select the signal on line 432 output by buffer 430 which is provided to driver 462, when test mode 1 is asserted and to select the input signal 412 from I/O pin 410 when test mode 1 is not asserted. Thus, input pin 410 provides two test signals to the peripheral core when the peripheral core is being tested, one signal through driver 440 and another through driver 462 which was stored for one cycle in test register 420.

Test mode 2, provided on signal line 477, controls driver 450 so that driver 450 is enabled providing signals to the processor core when test mode 2 is active. For normal functions (i.e. non-test), input pin 410 is connected to the peripheral core through multiplexer 460 and 462.

Figure 4B:
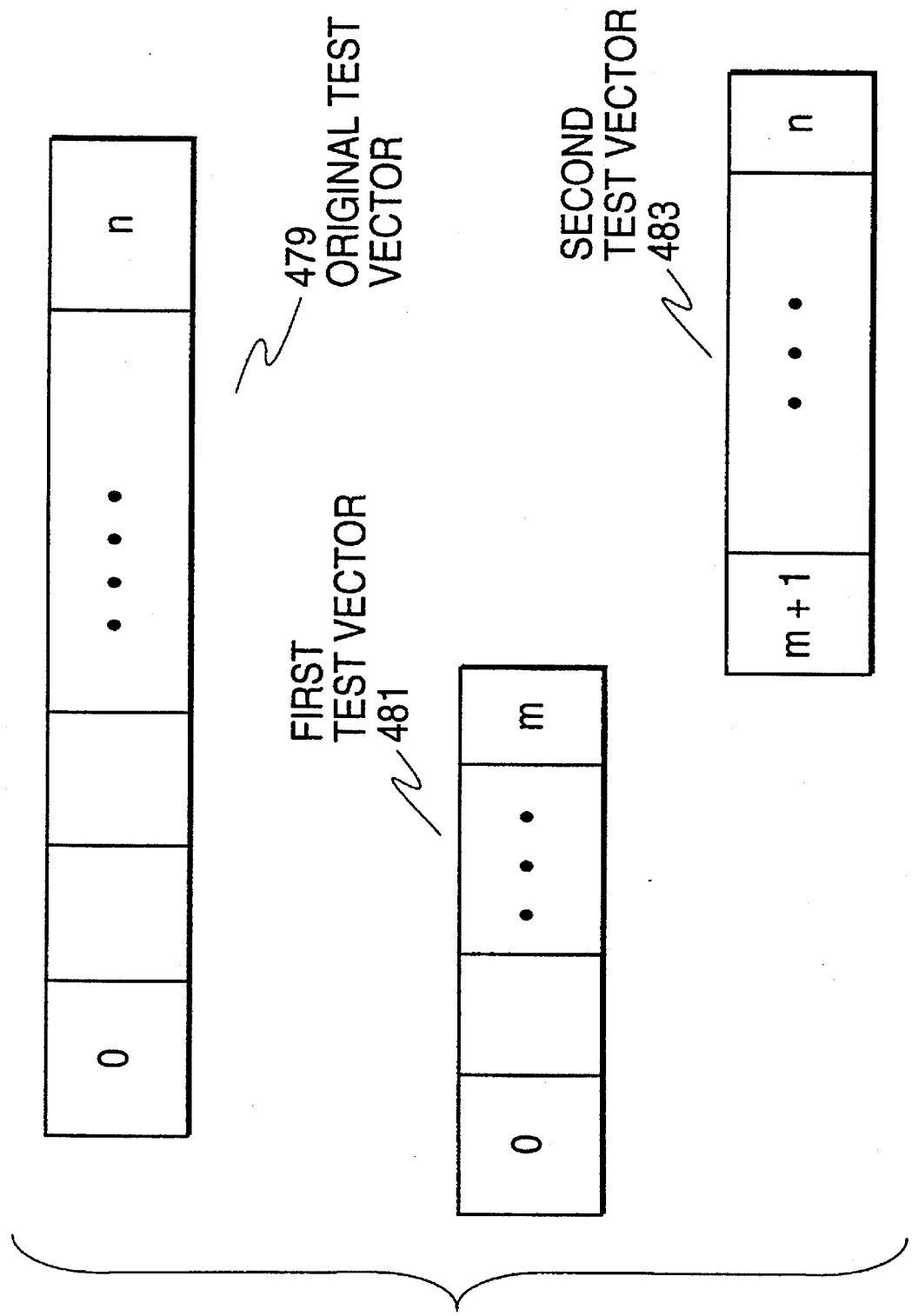
FIG. 4b shows the modification of a test vector to a first and second test vector.

FIG. 4b shows a single test vector 479 of a test vector set that was preexisting for, e.g., the peripheral controller core. The test vector 479 consists of n values which are applied to the n input pins and/or bidirectional pins present on the peripheral logic core 310. However, due to the lack of accessibility from the pins of the integrated circuit 300 into which the peripheral logic core 310 has been embedded, the test vector 479 must be modified.

In order to test a core, e.g., the peripheral logic core 310, according to the invention, the original test vector 479 must be modified, preferably by a computer, to form the two test vectors 481 and 483 shown in FIG. 4b. The first test vector 481 contains signals 0 to m to be applied to the input pins of the integrated circuit 300 during a first cycle. The second test vector 483, contains m+1 to N signals to be applied to the input pins of the integrated circuit 300 during a subsequent second cycle. The test vector 479 is mapped into the first and second test vectors 481 and 483 according to which input pins require associated test latches 420 as discussed further in the test scenario example herein. Each test vector of the set of test vectors for the core will be divided as described above, to accommodate the fact that all of the I/O pins of the core are not available at the I/O of the integrated circuit.

An example of a test scenario, according a preferred embodiment of the invention is as follows. A test instruction is scanned into TAP 350 to reconfigure specific I/O pins as test control pins. At least one such pin is utilized to control the LOAD TR signal 470. Additionally, a test instruction is scanned into the TAP 350 to set a test mode 1 register, which supplies test mode 1 signal 475.

Then the test patterns are applied as follows. Each of the original test vectors are applied in two cycles using the modified test vectors, shown by way of example in FIG. 4b. The first test vector 481 is applied during a first cycle (i.e. the load cycle) to the input pins of integrated circuit 300, which are mapped to the first test vector, e.g. input pin 410. The LOAD TR signal 470 is activated to load the value at input pin 410 into test register 420. Additional test registers (not shown), which are connected to other integrated circuit inputs pins, are also loaded at this time. In this way all of the signals 1 to m in vector 481 are loaded into m test registers.

Then a second cycle (the apply cycle) is activated to apply vector 483 to the I/O of integrated circuit 300. During this second cycle, the test signals contained in the test registers are applied to the core under test through, e.g., buffer 430, multiplexer 460, and driver 462. Similar drivers are provided where necessary for the other test registers. Simultaneously, (m+1 to n) values of the test vector 483 are applied to the integrated circuit I/O pins, including pin 410, and are applied to the core under test through, e.g., buffer 440. In this way, the test vector 479, is applied to the core under test utilizing the load and apply cycles described.

In order to observe the test results, the output pins of the core under test are mapped to the integrated circuit I/O pins. Additionally, test registers in the integrated circuit can be used to latch the output values. These values could then be retrieved in a two step process if necessary, similar to the two step load and apply cycle.

This load and apply sequence is performed until the entire test vector set is applied to the core under test.

FIG. 5 shows another embodiment of the invention with one integrated circuit input pin 523 being connected to test register 501 utilized to test a processor core contained in integrated circuit 500. Test register 501 is controlled by load signal 521 provided from input pin 551 through AND gate 509. Test mode signal 531 is also provided to AND gate 509 and is utilized to reconfigure pin 551 as a test control pin. Test mode signal 531 is controlled by a TAP. The test register 501 is loaded only when the test mode signal is active. When the integrated circuit 500 is being used functionally (i.e. non-test mode), pin 551 goes to a core (or other logic) other than the processor core through signal line 511.

Test register 501 is connected to driver 503 which in turn is connected via signal line 525 to the processor core being tested. The test access port controls the test mode signal 531 through private JTAG instructions defined for each of the test modes. These private instructions and the JTAG architecture are described further herein.

Under normal integrated circuit operations, the signal is provided from input 523 through signal line 529 to logic which is not the processor core. An additional driver 505 is also connected to input pin 523. This driver is enabled by test mode signal 531 and is connected to the processor core via signal line 527 for test purposes only. Signal lines 525 and 527 may be dotted with signals that are provided to the processor core during functional operations (i.e., non-test).

Referring back to FIG. 4B, during a first cycle, the test vector 481 is applied to the input pins of integrated circuit 500. One of the values of signals 0 to m, will be applied to input 523. The test access port has been accessed such that the test mode signal 531 is active and pin 551 has been reconfigured as a test control pin when the test vector 481 is applied. In this manner, during the first cycle, the input signal present in the first test vector is stored in test register 501. During a second cycle, the load signal 521 is turned off using input pin 551. During the second cycle, the second test vector 483 is applied to the integrated circuit 500. During this second cycle one of the values contained in test vector 483 is applied to input pin to 523. Since test mode signal 531 is asserted, drivers 503 and 505 are active and the signal value stored in test register 501 from test vector 481 is applied through driver 503 to the processor core. Simultaneously, the test vector value from test vector 483 from input pin 523 is applied to the processor core through buffer 505 and signal line 527. In this manner, the test vector as depicted in test vector 479 is applied to the processor core.

Thus, during the first cycle, the test registers are loaded and hold the first half of the vector (i.e. vector 481). During the second cycle, the values of the test vector 481 stored in the test registers are applied to the core simultaneously with the values from the input pins (i.e. vector 483).

The same approach is used for the other cores which require additional test registers so that a single input pin on the integrated circuit will provide multiple test inputs to the cores. Where a particular core does not require additional input pins, an approach similar to that shown in relation to FIG. 2a can be utilized.

In the preferred embodiment, the test access port implements the TAP controller described in the IEEE 1149.1

(1990) specification. The TAP controller consists of a serial access port which has 5 I/O pins, a control line TMS, a clock line, TCK, a TRST line, and data in and data out TDI and TDO respectively. The protocol defined in the IEEE 1149.1 specification is used to send commands to the TAP. Predefined commands include EXTEST, INTEST, BYPASS, IDCODE and SAMPLE/PRELOAD. In addition to the predefined commands, the IEEE 1149.1 protocol allows user defined commands, i.e. private instructions. These user defined commands are used in the preferred embodiment to reconfigure I/O pins for test purposes. For instance, some of the pins used functionally as input only, may need to be configured as output pins for test purposes. Additionally, some of the input pins may need to be configured as control pins such as for pin 551. Additionally, the commands may be used to disable certain of the output pins in other cores to ensure a core under test can be isolated to safely apply input patterns and observe the results. Finally, the TAP is used to control the test mode signals. A private instruction is utilized to set necessary registers supplying the test mode signals. A private instruction or series of instructions is used to reset the test mode signals as required. For each core that is being tested separately, a separate JTAG instruction may be used to set up each core for testing.

In other embodiments, each test vector may be divided into more than two test vectors. For example, each test vector may be divided into three or more parts and applied in three or more cycles depending on the I/O limitations.

While preferred embodiments of the invention have been described, modifications of the described embodiments may become apparent to those of ordinary skill in the art, following the teachings of the invention, without departing from the scope of the present invention as set forth in the appended claims.

What is claimed is:

1. A method of applying test vectors to a single integrated circuit containing at least one logic core for which a preexisting test vector set exists, the test vector set having a plurality of test vectors normally applied in one cycle, the method comprising the steps of:

(a) converting each test vector of the test vector set into a first and second test vector;

(b) applying the first test vector to input pins of the single integrated circuit during a first time period;

(c) loading a test register connected to one of the input pins with a signal value from the first test vector, the test register being connected between the one input pin and a logic core under test;

(d) applying the second test vector to the input pins during a second time period;

(e) providing to the logic core under test the signal value stored in the test register concurrently with a signal value from the second test vector applied to the one input pin during the second time period;

(f) observing the results; and repeating steps (b) through (f) for each test vector until the logic core is tested with each test vector in the test vector set.

2. The method according to claim 1 further comprising the step of providing a test mode signal to a first driver connected between the test register and the logic core under test and providing the test mode signal to a second driver connected between the one input pin and the logic core under test to enable the first and second drivers.

3. The method according to claim 1, further comprising the step of providing a load signal to the test register to load the test register with the signal value from the one input pin.

4. The method according to claim 1 further comprising the step of reconfiguring a pin of the single integrated circuit as a test pin and providing the load signal through the test pin, the test pin being reconfigured according to a test signal supplied from a test interface.

5. The method according to claim 1, further comprising the steps of:

(g) converting each test vector of a second test vector set previously created to be applied in one cycle to a second logic core under test, into a third and a fourth test vector;

(h) applying the third test vector to input pins of the single integrated circuit during a third time period;

(i) loading a second test register connected to another of the input pins with a signal value from the third test vector, the second test register being connected between the other input pin and the second logic core under test;

(j) applying the fourth test vector to the input pins during a fourth time period;

(k) providing the signal value stored in the second test register concurrently with a signal value from the fourth test vector applied to the other input pin during the fourth time period, to the second logic core under test;

(l) observing the results; and repeating steps (h) through (l) until the entire converted second test vector set is applied to the second logic core.

6. The method according to claim 5, further comprising the step of providing a load signal to the second test register to load the second test register with the signal value of the third test vector.

7. The method according to claim 2, wherein the test mode signal is provided from a test interface.

8. The method according to claim 7, wherein the test interface is a JTAG test access port.

9. The method according to claim 5 further comprising the step of providing a second test mode signal to a third driver connected between the second test register and the second logic core under test and providing the second test mode signal to a fourth driver connected between the other input pin and the second logic core under test to enable the third and fourth drivers.

10. A method of applying test vectors to a single integrated circuit containing a logic core under test, the method comprising the steps of:

(a) dividing a test vector into a first test vector and a second test vector;

(b) applying the first test vector to specific input pins of the integrated circuit during a first time period;

(c) loading test registers connected to respective ones of the specific input pins with the first test vector;

(d) applying the second test vector to input pins of the integrated circuit, including the specific input pins, during a second time period; and (e) providing to the logic core under test, the first test vector stored in the test registers concurrently with the second test vector applied to the input pins during the second time period.

11. The method according to claim 10, wherein the test registers are respectively connected between the specific input pins and a set of first drivers, the first drivers being connected to the logic core under test.

12. The method according to claim 11, wherein at least a portion of the second test vector is supplied to the logic core under test through a second set of drivers.

13. The method according to claim 12, wherein the first and second set of drivers are enabled according to a test mode signal supplied from a test interface connected to the first and second drivers.

14. An apparatus for applying test vectors to a single integrated circuit containing a logic core under test, comprising:

a circuit to divide a test vector into a first test vector and a second test vector;

a plurality of test registers connected to respective ones of specific input pins of the integrated circuit, the test registers storing the first test vector applied to the specific input pins during a first time period; and a plurality of first drivers connected between the test registers and the logic core under test;

wherein a test control signal is connected to the first drivers to enable the first drivers, thereby simultaneously applying the first test vector stored in the test registers and the second test vector supplied from the input pins during a second time period, to the logic core under test.

15. The apparatus as recited in claim 14 further comprising a plurality of second drivers connected between input pins of the integrated circuit and the logic core under test, said second drivers being connected to said test control signal.

16. The apparatus as recited in claim 14, further comprising a load test register signal supplied to the test registers to control loading of the test registers, the load test register signal being supplied from a test input pin of the integrated circuit.

17. The apparatus as recited in claim 16, further comprising means for reconfiguring a pin of the integrated circuit as the test input pin, according to a signal from a test interface.

18. The apparatus as recited in claim 14, further comprising:

a test access port accessed through input and output pins of the integrated circuit; and a register supplying the test control signal, a value of the register being controlled by the test access port.

19. A method of applying test vectors to a single integrated circuit containing at least one logic core under test, the method comprising the steps of:

(a) dividing a test vector into first to N–1 (N being an integer greater than or equal to 2) test vectors and an Nth test vector;

(b) applying the first to N–1 test vectors to input pins of the integrated circuit during a first to N–1 time period, respectively;

(c) loading a first to N–1 set of test registers connected to respective ones of the input pins with the first to N–1 test vectors during the first to N–1 time periods, respectively;

(d) applying the Nth test vector to input pins of the integrated circuit, during an Nth time period; and (e) providing to the logic core under test, the first through N–1 test vectors stored in the test registers concurrently with the Nth test vector applied to the input pins during the Nth time period.

* * * * *